(12) United States Patent
Troxtell et al.

(10) Patent No.: US 6,206,198 B1
(45) Date of Patent: Mar. 27, 2001

(54) LIGHTWEIGHT, HIGH TEMPERATURE PACKING REEL FOR INTEGRATED CIRCUITS

(75) Inventors: Clessie Troxtell, Howe; Michael Hayden, Plano, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/365,682

(22) Filed: Aug. 3, 1999

Related U.S. Application Data
(60) Provisional application No. 60/096,209, filed on Aug. 11, 1998.

(51) Int. Cl.[7] ............................................... B65D 73/02
(52) U.S. Cl. ........................................ 206/714; 206/389
(58) Field of Search ........................... 206/701, 706–709, 206/713–718, 400, 408, 398, 389; 34/521, 108, 109, 132

(56) References Cited

U.S. PATENT DOCUMENTS

| | | | | |
|---|---|---|---|---|
| 5,136,827 | * | 8/1992 | Sawaya | 206/714 |
| 5,238,105 | * | 8/1993 | Smiley | 206/408 |
| 5,318,181 | * | 6/1994 | Stover et al. | 206/714 |
| 5,494,168 | * | 2/1996 | Hart | 206/714 |
| 5,875,897 | * | 3/1999 | Duncan et al. | 206/714 |

* cited by examiner

Primary Examiner—Paul T. Sewell
Assistant Examiner—Luan K. Bui
(74) Attorney, Agent, or Firm—Gary C. Honeycutt; Fred Telecky

(57) ABSTRACT

A lightweight packing reel for storing encapsulated semiconductor devices which may be baked for extended periods of time at temperatures sufficiently high to desorb moisture from the packages, and which allows efficient flow of heat and air through the tape and reel assemblage is provided.

8 Claims, 4 Drawing Sheets

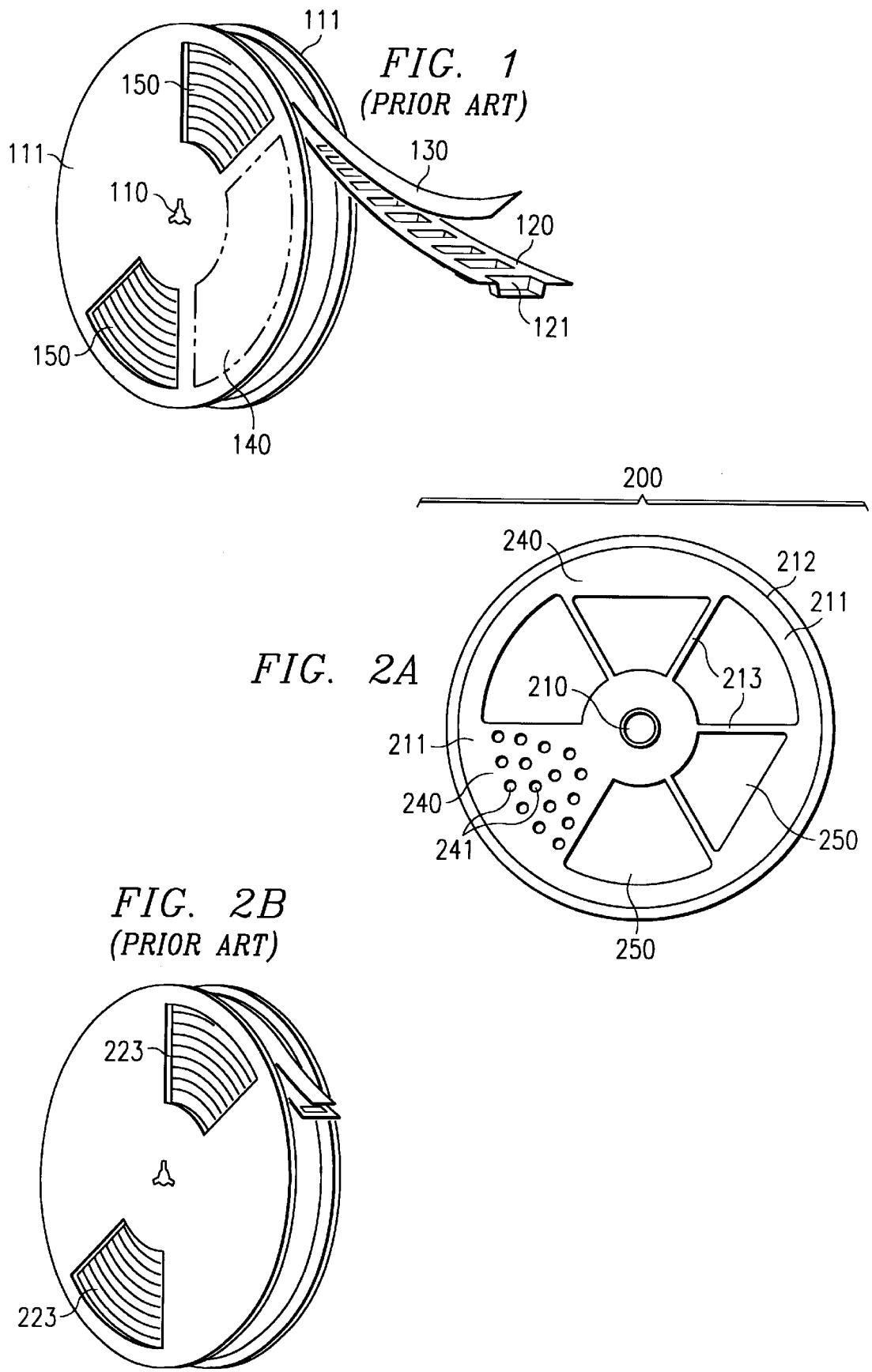

LIGHTWEIGHT, HIGH TEMPERATURE PACKING REEL FOR INTEGRATED CIRCUITS

This application claims the benefit of U.S. Provisional Application Ser. No. 60/096,209 filed Aug. 11, 1998.

FIELD OF THE INVENTION

This invention relates generally to semiconductor devices and more specifically to packing reels used to hold packaged semiconductor devices for storage and baking.

BACKGROUND OF THE INVENTION

Surface mount integrated circuit devices are subject to delamination of the encapsulating plastic mold compound from the lead frame during solder attachment to a printed wiring board. In extreme cases the package cracks, which may in turn result in opens, or other reliability failures during use, or in testing. The failure mechanism has been traced to absorption of moisture by the molding compound, which vaporizes when the device is subjected to rapid heating during solder reflow processing, and the resulting vapor exerts pressure at the plastic to metal interface. This problem has intensified as packages have become larger and thinner.

In order to avoid the failure, plastic encapsulated devices which are subject to the problem must be baked relatively slowly at a temperature high enough, and for sufficient length of time to drive the moisture out of the package. Once the devices have been dried, they are sealed in a vapor barrier container, along with a desiccant for shipping and storing. The devices undergo dry baking after they have completed assembly processing and testing, and again after the containers have been opened, if they have not been used within the allowable time. Standards committees, such as EIA (Electronic Industries Association) and JEDEC (Joint Electronic Devices Engineering Council) have set specific standards related to this issue based on integrated circuit packages type, standards for testing procedures, and also standards for packing containers used for the shipping and storage.

The process of baking plastic encapsulated integrated circuits, and sealing in vapor barrier containers is generally known as dry packing. Historically, larger devices which require dry packing are placed in plastic trays with a cavity or recess sized to hold each device securely. Baking to remove absorbed water can be performed either in these trays, or the devices can be loaded into the trays immediately after dry baking. Trays loaded with dried components are placed in a seal-able vapor bag with a desiccant for shipping and storing. The trays are constructed of plastic materials which are thermally stable over the temperature range required for dry baking, typically 125 deg C. Packing trays have a number of drawbacks; namely, they are constructed of costly materials, they are bulky which contributes significantly to the shipping weight and volume, and they require space consuming automated pick and place equipment. In an attempt to minimize costs, some trays are returnable, thereby adding another expense. Automated pick and place equipment consists of large x/y tables with robot handling.

Small integrated circuit packages which require no dry packing are usually placed directly into a sprocket guided carrier tape which has a series of recesses sized to fit the devices. The recesses are set at a defined pitch, and the devices are held in place by a cover tape. The tape loaded with semiconductor devices is wound onto a packing reel, and the reel assemblage stored in a corrugated container. Tape and reel dimensions are specified by standards in order to insure uniformity between suppliers. Generally, the tape widths range from 8 mm to 56 mm and the reel is 330 millimeters in diameter. However, the reel diameter may be changed according to the volume of devices needed.

Tape and reel packaging provides a compact means for storing, transporting, and dispensing integrated circuits. The reel is placed directly onto a relatively small piece of equipment for picking and placing the circuits, and as a result this type of handling equipment has become much more desirable to the end user than the more bulky x/y table used to pick and place from trays.

Consequently, a need for packing reels and an assemblage which is compatible with dry baking integrated circuit devices has developed. Simply using existing reels constructed of high temperature plastic has not been successful because the design is inefficiency for baking, and because high temperature plastics are generally more dense, thus resulting in additional shipping weight.

SUMMARY OF THE INVENTION

It is an object of this invention to provide a packing reel which conforms to existing industry standards, and is capable of being changed with respect to size and labeling, but which can be used to efficiently bake encapsulated integrated circuits for removing absorbed water. In order to meet this requirement, the reel must be dimensionally stable for extended periods of time at 125–130 deg C.

Packing reels of prior art are not optimized for air flow through the reel, thus adding to the time required to heat and cool the assemblage during baking in a forced air oven. It is an object of this invention to provide a reel with hub and flange structure which allows air to flow through the reel, thereby reducing the time required to heat up and cool down the components, and thus supporting a decreased processing cycle time.

Further, it is an object of this invention to provide a reel having a means for uniform heating of the devices by allowing good air flow through the reel. Uniformly heating will allow reliable baking of each component.

It is an object of this invention to provide a reel which can be baked at the dry bake temperature repeatedly, such as for initial drying, as well as for rebaking of either fully loaded or partially loaded reels.

It is also an object of this invention to conserve the amount of material used in construction of the reel, thereby eliminating unnecessary consumption of costly high temperature thermoplastic. The reel of this invention may be formed by low cost injection molding which further takes advantage of material conservation, and avoids waste disposal. Further, a relatively lightweight reel is provided which minimizes shipping weight.

It is also an object of this invention to provide a reel which can be constructed of either thermally stable plastic suitable for baking, or a plastic which is not suitable for baking, but does take advantage of the relatively lighter weight construction.

It is still further an object of the invention to provide an assemblage which includes a reel with carrier and cover tapes which meet the dry bake requirements.

It is still further an object of this invention to provide a tape and reel assemblage suitable for leaded surface mount packages, as well as more advanced devices such as ball grid array (BGA) or chip scale packages (CSP).

Other objects and advantages of the present invention will become apparent from the following descriptions, taken in connection with the accompanying drawings. The drawings constitute a part of this specification and include an exemplary embodiment of the invention, which may be embodied in various forms. It is to be understood that in some instances aspects of the invention may be shown exaggerated or enlarged to facilitate an understanding of the invention.

BRIEF DESCRIPTION OF THE DRAWINGS

FIG. 1 is a perspective view of a tape and reel assemblage of prior art for storing integrated circuit packages.

FIG. 2A is a side view of the reel flange and hub structure of this invention.

FIG. 2B shows the reel and flange structure of existing art.

DETAILED DESCRIPTION OF A PREFERRED EMBODIMENT

Figure 3A:
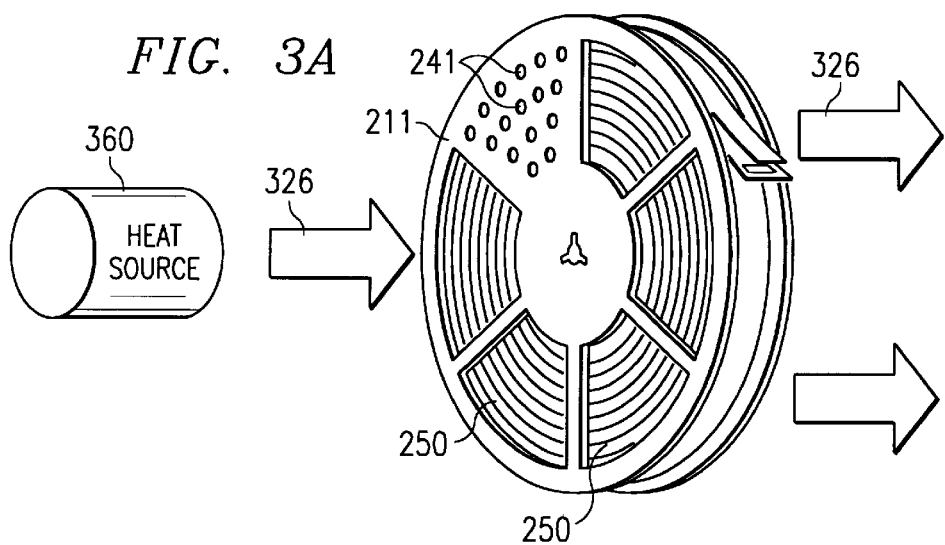
FIG. 3A demonstrates the air flow pattern of this invention.

Turning now to the drawings, FIG. 1 provides a schematic of a tape and reel packing assemblage of prior art with a reel having a hub 110 and parallel flanges 111, a carrier tape 120 with cavities 121, and a cover tape 130. The reel, generally constructed of plastic, provides areas on the flange where labels 140 must be placed to provide information pertaining to the integrated circuit devices. Large openings called Windows 150 in the flange are not specified, but may exist to provide a convenient means to grasp the reel. Cavities in the carrier tape have been formed by either punching or embossing. The cover tape has a heat or pressure sensitive adhesive on predefined sealing areas which attaches to the carrier tape, and holds the encapsulated integrated circuit securely in the cavity.

Integrated circuit packages may be automatically vacuum loaded into each cavity in the carrier tape, the tape indexed to the next position, a cover tape sealed onto the loaded cavity, and the tape indexed onto the reel. For unloading, the procedure may be reversed.

In FIG. 2A, one side of a packing reel 200 of the preferred embodiment of the current invention is shown. Dimensions of the reel conform to industry standards, and are capable of being adjusted as industry requires. The reel comprises a central hub 210 whose radius is about 25% of the radius of the reel, and parallel flanges. The flange 211 of the preferred embodiment has an outer rim 212 with a series of spokes 213 which provide mechanical support and rigidity to the reel. Solid areas 240 are designated for the required labels, the largest of these has a large number of openings 241 which allow air to flow through the reel. A major portion of the flange area, about 75% consists of windows 250. The area of the multiple window openings is maximized in order to allow air to flow freely through the reel where ever possible, and to avoid excessive use of plastic in construction of the reel. For both the windows 250 and the smaller openings 241, a like sized opening is located on the opposite flange, and like openings are aligned.

Current requirements for label 240 locations and sizes are comprehended on the reel of the preferred embodiment, but it is adaptable for future changes.

By contrast, FIG. 2B shows a reel of prior art, wherein the flange is solid except for two window openings 223 on opposite sides of each flange. While this structure is typical of those found in the industry, the windows are unspecified and variations do exist.

The reel of this invention as shown in FIG. 2A is constructed of a thermoplastic material which will maintain dimensional stability without significant shrinkage or warping at 130 deg C. for extended bake periods. Further, the plastic must not emit outgassing products which could contaminate the semiconductor devices. A fiber filled polycarbonate is one such material, and comprises the preferred embodiment of this invention. Specifications for baking plastic encapsulated integrated circuits require baking at 125 deg C., but a safety margin of 5 deg C. is provided by this reel. Alternate suitable materials include some polyesters. The material of the existing non-bakable reels in FIG. 2B is a plastic whose dimensional stability is typically only about 50 deg C., such as polystyrene.

It is possible to have a reel of existing art, as depicted in FIG. 2B, but which is constructed of a more thermally stable plastic. However, the flow pattern of heated air would be similar to that shown in FIG. 3B, wherein the air current as depicted by the arrows 316 which impinges on a solid area of the flange 221 is deflected, and passes only through the two windows 223, thus leading to non uniform and slower thermal response of the assemblage.

By contrast, the reel of the current invention as shown in FIG. 3A allows air currents 326 from the heat source 360, such as a convection oven to flow through the windows 250 and multiple openings 241 in the flange, thereby allowing the assemblage to respond rapidly to changes in temperature, and to reduce the time required to heat or cool the assemblage.

Figure 3B:
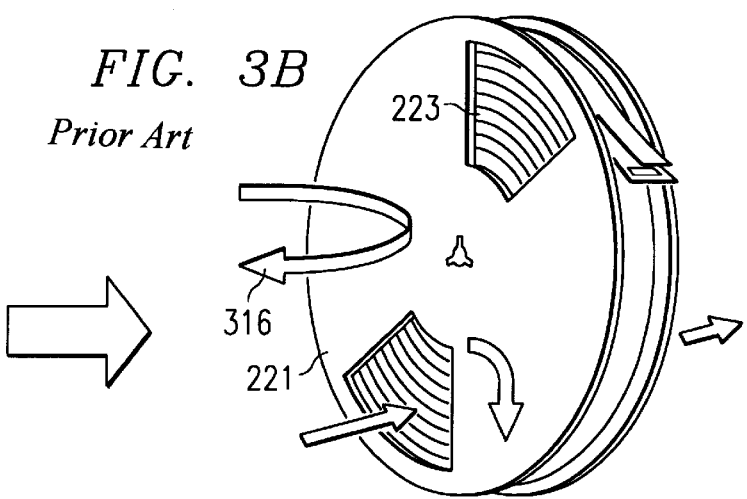
FIG. 3B demonstrates the air flow pattern of existing reels.

Blocking the heated air, such as shown in FIG. 3B results in non-uniform heating of the integrated circuit devices, and could result in either over-baking or reliability failures from under-baking. This problem is overcome by the air flow pattern in FIG. 3A of the current reel wherein each integrated circuit package is capable of being heated uniformly. It should be noted that in either reel configuration, the embossed or etched tape loaded with integrated circuit packages provides separation so that the tape is not tightly wound, but can allow air to circulate between the layers.

Figure 4:
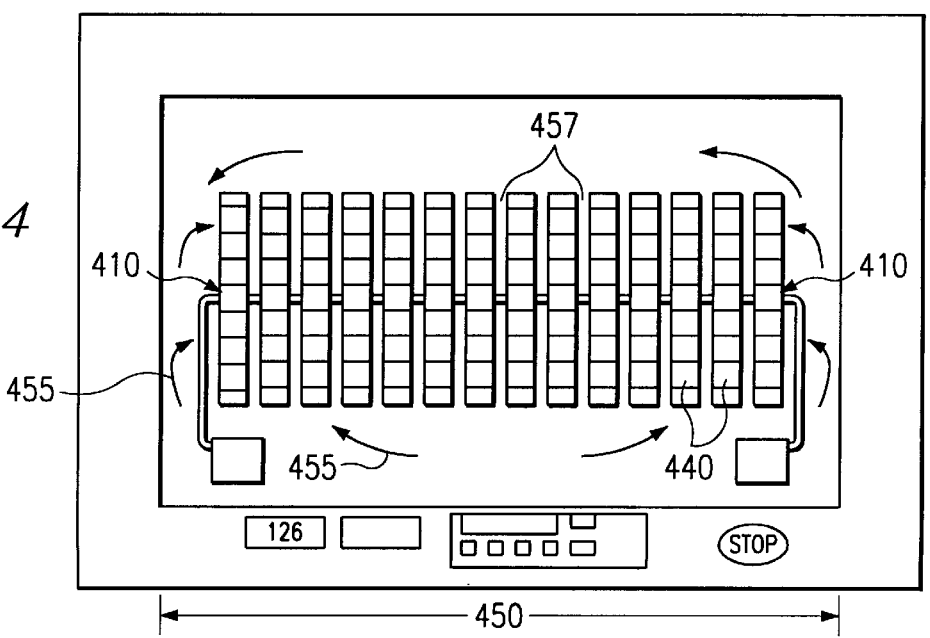
FIG. 4 demonstrates the forced air oven configuration for bakable tape and reel.

To further clarify the air flow source and its relationship to packing reels, FIG. 4 provides a sketch of a forced air oven 450 with vertically placed reels 440. Reels are supported on the hubs and a space is provided between reels. Heated air as indicated by the arrows 450 is free to circulate through openings in the flanges of the current invention, and allow both faster heating and cooling of the components, as well as more uniform baking of the devices.

Figure 5:
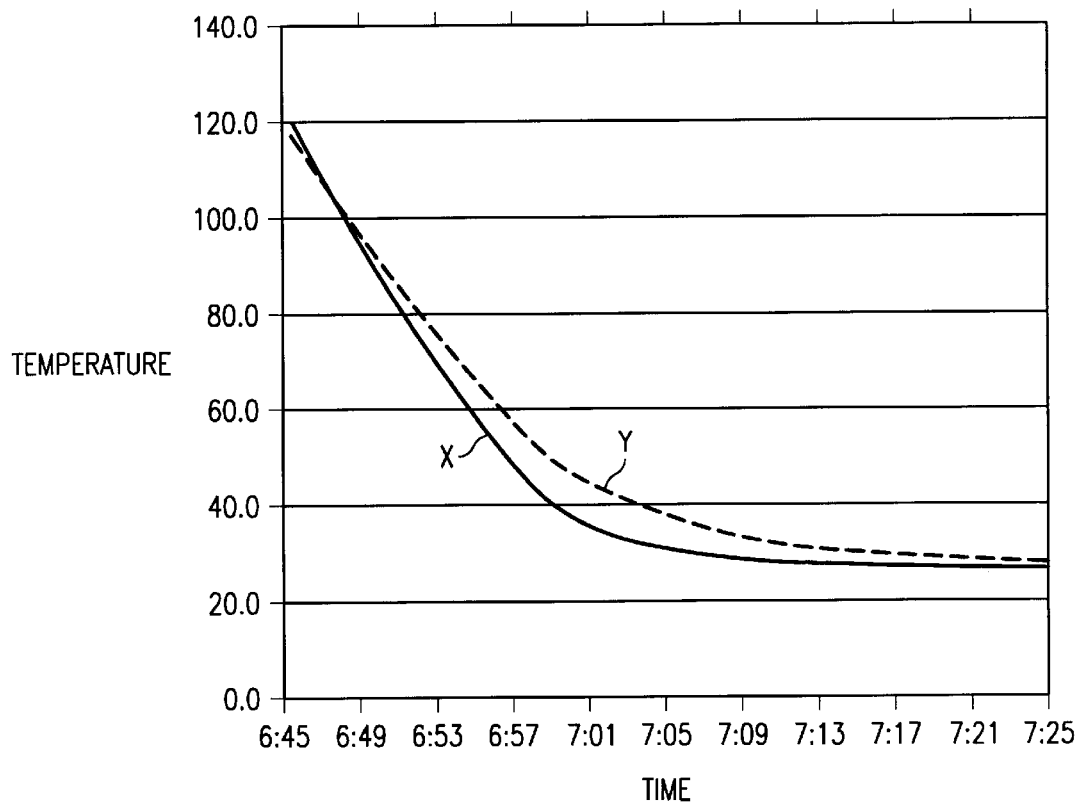
FIG. 5 provides experimental cooling profile data for this invention as compared to that of a reel of existing art.

FIG. 5 provides a chart of experimental data showing the cooling curve for an average of three points on a reel of this invention X, as compared to an average for three points on a reel of the existing art Y. It can be seen from the clock data that the time to cool from 120 deg C. to 40 deg C. for a reel of the existing design "Y" is 20 minutes versus 14 minutes for the reel "X" of this invention. Such cycle time savings are important because of the vast amount of oven capacity required for dry baking in a high volume manufacturing facility.

A reel of the current invention may be used for initial dry baking encapsulated integrated circuits at the source of manufacture, or for baking after removing from the moisture barrier package. The reel may be rebaked, either fully loaded or with a partial load of tape and components.

It is important in the manufacture of shipping reels that construction material be conserved whenever possible for the following reasons; to avoid waste of plastic, to minimize disposal of plastic material, to minimize material cost, and to minimize shipping and handling weight. The material content of a shipping reel of the current invention is reduced by about 30% versus that of a conventional reel constructed with the same material. This savings is a result of the large number of openings in the flanges.

The reel of the preferred embodiment comprises a thermally stable thermoplastic, such as fiber filled polycarbonate. It may be formed by injection molding, and is thereby ideally suited for using only the amount of material in the designed part, thus avoiding unnecessary waste and disposal. Further, the thermoplastic of the preferred embodiment is recyclable.

While the preferred embodiment comprises a lightweight, thermally stable reel for dry baking encapsulated integrated circuits, it may be constructed of plastic which is not compatible with baking, but which could provide the advantages of reduced weight and lower plastic usage.

Figure 6A:
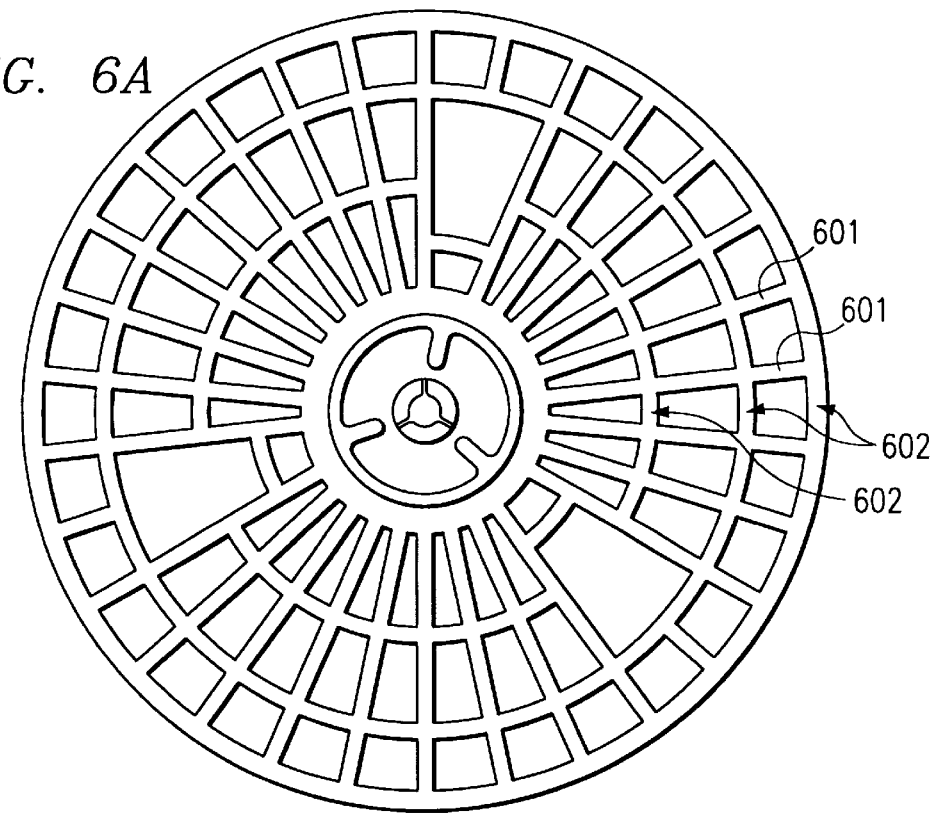
FIG. 6A and 6B demonstrate alternate reel configurations.
Figure 6B:
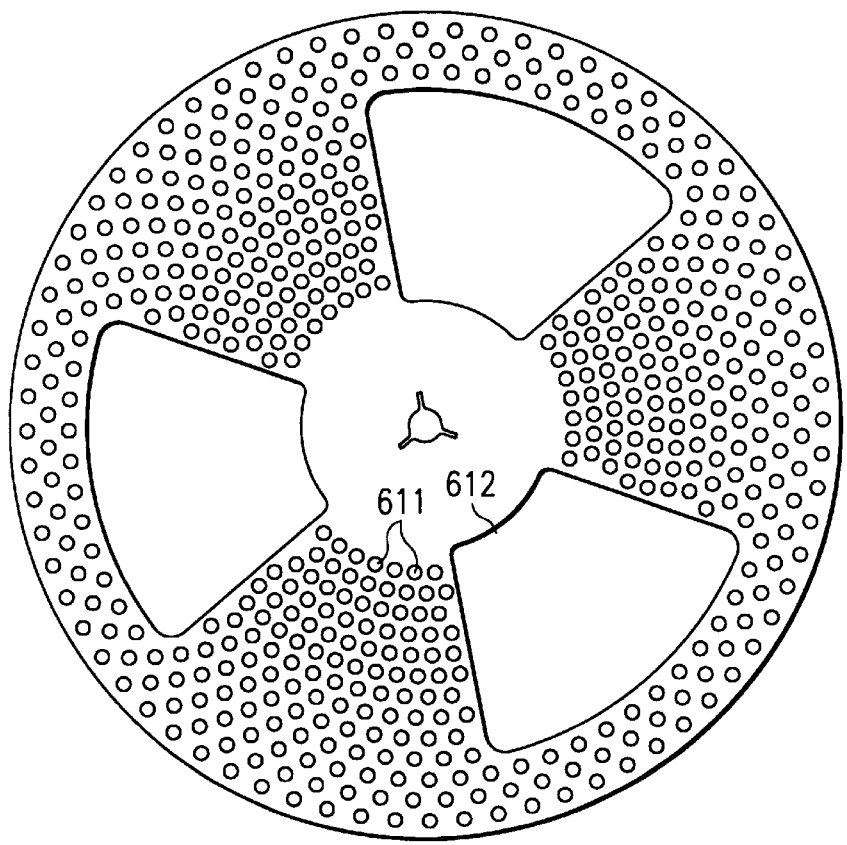

The invention has been described in connection with a preferred embodiment shown in FIG. 2A. FIGS. 6A and 6B demonstrate alternate lightweight reels suitable for baking integrated circuits. The reel of FIG. 6A consists entirely of spokes 601 and rings 602 and that in FIG. 6B provides a very high density of smaller holes 611 with a smaller number of windows 612. Both alternates allow uninterrupted flow of air.

Figure 7:
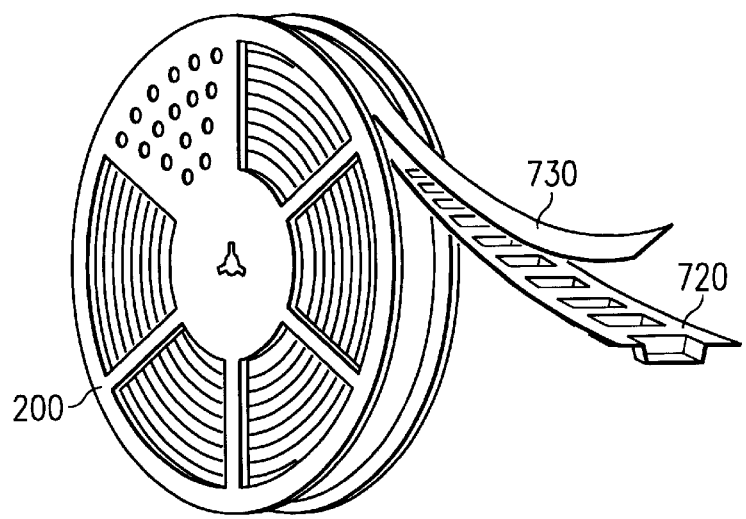
FIG. 7 demonstrates a tape and reel assemblage of the current invention.

FIG. 7 depicts a further aspect of the current invention; it provides an assemblage of the lightweight packing reel 200 dimensionally stable at 130 deg C., a carrier tape 720 which is both dimensionally stable and has no contaminating outgassing products at 130 deg C., and a cover tape 730 which remains transparent and adheres to the cover tape at 130 deg C. Suitable plastic materials for construction of the reel and carrier tape are polycarbonates, and the cover tape may be of PET with acrylic adhesive.

The assemblage of FIG. 7 may be loaded with packaged integrated circuits for storage, baking and transport; the devices may be leaded encapsulated plastic packages such as QFP, SOJ, SOIC or they may be any of the more advanced packages such as BGA or CSP.

While the invention has been described in connection with a preferred embodiment, it is not intended to limit the scope of the invention to a particular form set forth, but on the contrary, it is intended to cover alternatives, modifications, and equivalents as may be included within the spirit and scope of the invention as defined by the appended claims.

What is claimed is:

1. A packing reel having integrated circuit devices stored therein comprising:
    a) a thermoplastic hub and flanges, dimensionally stable at 130 deg C. for up to 24 hours;
    b) said flanges having a multitude of openings, and
    c) each of said openings placed directly opposite a like opening on the parallel flange so that air currents are allowed to flow through the reel, thereby allowing more uniform heating of the devices and shorter cycle time for heating and cooling.

2. A packing reel as in claim 1 wherein said openings result in about a 30% reduction in the amount of plastic in the flanges, thereby providing a light weight reel.

3. A packing reel as in claim 1 comprising fibrous polycarbonate.

4. A packing reel as in claim 1 which can remain dimensionally stable for multiple cycles at about 125 deg C., as required to desorb moisture from encapsulated integrated circuits.

5. A packing reel as in claim 1 wherein the flange and hub are adaptable to changes in diameter, and label size and location.

6. An tape and reel assemblage for storing and baking surface mount integrated circuit devices comprising:
    a) a reel as in claim 1;
    b) a packing tape which is dimensionally stable and has no contaminating outgassing products at about 125 deg C., and
    c) a cover tape which remains transparent, and adheres to said packing tape at about 125 deg C.

7. An assemblage as in claim 6 comprising a polycarbonate carrier tape and reel.

8. A packing integrated circuit devices stored therein comprising:
    a) a thermoplastic hub and flanges, dimensionally stable at 130 deg C. for up to 24 hours;
    b) said flanges having a multitude of openings;
    c) said openings reduce the amount of plastic used by about 30%, thereby providing a light weight reel;
    d) each of said openings placed directly opposite a like opening on the parallel flange so that air currents are allowed to flow through the reel, thereby allowing more uniform heating of the devices and shorter cycle time for heating and cooling, and
    e) said reel comprising fibrous polycarbonate.

* * * * *